United States Patent
Olenick et al.

(10) Patent No.: US 9,917,216 B2
(45) Date of Patent: Mar. 13, 2018

(54) FLEXIBLE KESTERITE PHOTOVOLTAIC DEVICE ON CERAMIC SUBSTRATE

(71) Applicants: International Business Machines Corporation, Armonk, NY (US); ENrG Inc., Buffalo, NY (US)

(72) Inventors: John A. Olenick, Buffalo, NY (US); Teodor K. Todorov, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/532,810

(22) Filed: Nov. 4, 2014

(65) Prior Publication Data
US 2016/0126377 A1 May 5, 2016

(51) Int. Cl.
*H01L 31/00* (2006.01)
*H01L 31/032* (2006.01)
*H01L 31/18* (2006.01)
*H01L 31/0216* (2014.01)
*H01L 31/0392* (2006.01)

(52) U.S. Cl.
CPC .... *H01L 31/0326* (2013.01); *H01L 31/02168* (2013.01); *H01L 31/03926* (2013.01); *H01L 31/1864* (2013.01); *Y02E 10/50* (2013.01); *Y02P 70/521* (2015.11)

(58) Field of Classification Search
CPC .................................................... H01L 31/056
See application file for complete search history.

(56) References Cited

U.S. PATENT DOCUMENTS

| | | |
|---|---|---|
| 5,089,455 A | 2/1992 | Ketcham et al. |
| 5,273,837 A | 12/1993 | Aitken et al. |
| 7,531,261 B2 | 5/2009 | Badding et al. |
| 8,580,157 B2 | 11/2013 | Fukano et al. |
| 2004/0265663 A1 | 12/2004 | Badding et al. |
| 2006/0113992 A1* | 6/2006 | Tilbrook ............ G01R 33/0356 324/249 |

(Continued)

FOREIGN PATENT DOCUMENTS

EP 2557198 A1 2/2013

OTHER PUBLICATIONS

Katagiri et al., "Development of CZTS-based thin film solar cells," Thin Solid Films, vol. 517, Issue 7, pp. 2455-2460 (Feb. 2009).
S. Ishizuka, "A flexible CIGS solar cell with energy conversion efficiency of 17.7 %" AIST Today, vol. 8, No. 10 p. 20 (2008).

(Continued)

*Primary Examiner* — Caridad Everhart
*Assistant Examiner* — Ankush Singal
(74) *Attorney, Agent, or Firm* — Vazken Alexanian; Michael J. Chang, LLC (57) ABSTRACT

Kesterite-based photovoltaic devices formed on flexible ceramic substrates are provided. In one aspect, a method of forming a photovoltaic device includes the steps of: forming a back contact on a flexible ceramic substrate; forming a kesterite absorber layer on a side of the back contact opposite the flexible ceramic substrate; annealing the kesterite absorber layer; forming a buffer layer on a side of the kesterite absorber layer opposite the back contact; and forming a transparent front contact on a side of the buffer layer opposite the kesterite absorber layer. A roll-to-roll-based method of forming a photovoltaic device and a photovoltaic device are also provided.

20 Claims, 5 Drawing Sheets

(56) References Cited

U.S. PATENT DOCUMENTS

| | | |
|---|---|---|
| 2008/0241421 A1 | 10/2008 | Chen et al. |
| 2011/0186103 A1 | 8/2011 | Kobayashi et al. |
| 2012/0061790 A1 | 3/2012 | Ahmed et al. |
| 2012/0100663 A1 | 4/2012 | Bojarczuk et al. |
| 2012/0100664 A1* | 4/2012 | Guha ............... H01L 21/02422 438/86 |
| 2012/0193349 A1* | 8/2012 | Callahan ........... H01L 21/02551 219/600 |
| 2013/0074915 A1* | 3/2013 | Deligianni ......... H01L 31/0749 136/256 |
| 2014/0007934 A1* | 1/2014 | Yun ................... H01L 31/02167 136/256 |
| 2014/0048137 A1 | 2/2014 | Cao et al. |
| 2014/0096826 A1 | 4/2014 | Todorov |
| 2015/0087106 A1* | 3/2015 | Beck ................. H01L 31/02008 438/72 |
| 2016/0035927 A1* | 2/2016 | Gershon ............ H01L 31/0326 136/244 |
| 2017/0062634 A1* | 3/2017 | Luo .................... H01L 31/0326 |
| 2017/0194518 A1* | 7/2017 | Gershon ........... H01L 31/02244 |

OTHER PUBLICATIONS

S. Ishizuka et al., "Alkali incorporation control in Cu (In, Ga) Se2 thin films using silicate thin layers and applications in enhancing flexible solar cell efficiency," Applied Physics Letters, vol. 93, No. 12, Sep. 2008, 124105.

Dullweber et al., "Back surface band gap gradings in Cu(In,Ga)Se2 solar cells," Thin Solid Films, vol. 387, (May 11-13, 2001).

A. Weber et al., "On the Sn loss from thin films of the material system Cu—Zn—Sn—S in high vacuum," Journal of Applied Physics 107, 013516 (Jan. 2010).

Mitzi et al., "The path towards a high-performance solution-processed kesterite solar cell," Solar Energy Materials & Solar Cells 95 (Jun. 2011) 1421-1436.

Patchett et al., "A high-yield vacuum-evaporation-based R2R-compatible fabrication route for organic electronic circuits," Organic Electronics, vol. 15, issue 7 pp. 1493-1502 (Jul. 2014).

Q. Lin et al., "Flexible photovoltaic technologies," Journal of Materials Chemistry C, vol. 2, No. 7, 2014, pp. 1233-1247 (Published Dec. 2013).

Morse et al., "Nanofabrication Technologies for Roll-to-Roll Processing," Report from the NIST-NNN Workshop, Sep. 27-28, 2011.

* cited by examiner

FLEXIBLE KESTERITE PHOTOVOLTAIC DEVICE ON CERAMIC SUBSTRATE

FIELD OF THE INVENTION

The present invention relates to photovoltaic devices and more particularly, to kesterite-based photovoltaic devices formed on flexible ceramic substrates, e.g., using roll-to-roll (R2R) manufacturing.

BACKGROUND OF THE INVENTION

Flexible ceramic substrates offer significant technological advantages over commonly used soda-lime glass substrates. For example, flexible ceramic substrates have extremely high temperature resistance (with a softening point twice that of glass), from about 40 to about 80 times lower mass and thermal budget (which translates to proportionally faster heating/cooling times and lower energy consumption) and roll-to-roll (R2R) manufacturing compatibility. These qualities can result in higher-efficiency photovoltaic devices (due to higher processing temperatures), as well as a lower-cost, less labor-intensive industrial process.

The inertness and high temperature resistivity of ceramics is particularly important for materials which require high-temperature treatments (e.g., those above 500° C.) in aggressive environments, such as chalcogen-containing atmospheres used for high-quality chalcogenide solar cell absorbers. Insulating properties of ceramics allow monolithic series interconnection of photovoltaic devices through simple patterning.

S. Ishizuka, "A flexible CIGS solar cell with energy conversion efficiency of 17.7%" AIST TODAY, Vol. 8, No. 10 p. 20 (2008) (hereinafter "Ishizuka") describes CIGS devices on flexible substrates such as metal foils, ceramic sheets, and polymers. Ishizuka describes a CIGS solar cell with a flexible zirconia ceramic substrate having a 17.7% efficiency. Indium (a component of CIGS) is however a rare earth element, thus making the implementation of CIGS based materials expensive for wide scale production.

Thus, high-efficiency, low-cost alternatives to conventional CIGS-based devices which take advantage of the efficiency and manufacturing benefits of flexible ceramic substrates would be desirable.

SUMMARY OF THE INVENTION

The present invention provides kesterite-based photovoltaic devices formed on flexible ceramic substrates. In one aspect of the invention, a method of forming a photovoltaic device is provided. The method includes the steps of: forming a back contact on a flexible ceramic substrate; forming a kesterite absorber layer on a side of the back contact opposite the flexible ceramic substrate; annealing the kesterite absorber layer; forming a buffer layer on a side of the kesterite absorber layer opposite the back contact; and forming a transparent front contact on a side of the buffer layer opposite the kesterite absorber layer.

In another aspect of the invention, a roll-to-roll-based method of forming a photovoltaic device is provided. The method includes the steps of: dispensing a sheet of a flexible ceramic substrate material from a roll; forming a back contact as a continuous layer on the sheet of the flexible ceramic substrate material; forming a kesterite absorber layer as a continuous layer on a side of the back contact opposite the continuous sheet of the flexible ceramic substrate material; annealing the kesterite absorber layer; forming a buffer layer as a continuous layer on a side of the kesterite absorber layer opposite the back contact; and forming a transparent front contact as a continuous layer on a side of the buffer layer opposite the kesterite absorber layer.

In yet another aspect of the invention, a photovoltaic device is provided. The photovoltaic device includes: a flexible ceramic substrate; a back contact on a flexible ceramic substrate; a kesterite absorber layer on a side of the back contact opposite the flexible ceramic substrate; a buffer layer on a side of the kesterite absorber layer opposite the back contact; and a transparent front contact on a side of the buffer layer opposite the kesterite absorber layer.

A more complete understanding of the present invention, as well as further features and advantages of the present invention, will be obtained by reference to the following detailed description and drawings.

DETAILED DESCRIPTION OF PREFERRED EMBODIMENTS

Provided herein are flexible kesterite-based photovoltaic devices built on a flexible ceramic substrate. As provided above, CIGS materials contain rare earth elements such as indium (In), which increases production costs. Advantageously, kesterite materials are earth abundant and thus more cost effective for large scale implementation. Further, as highlighted above, the use of flexible ceramic substrates advantageously permits higher processing temperatures (thus leading to greater device efficiencies) and roll-to-roll (or sometimes referred to as reel-to-reel) (R2R) manufacturing compatibility (thus enhancing manufacturing ease and efficiency).

The term "flexible ceramic substrate," as used herein refers to a substrate formed from a ceramic material (e.g., zirconia, alumina, and/or titania) that is bendable without breaking. More specifically, the flexible ceramic substrates employed herein preferably can be processed using R2R manufacturing which, as will be described in detail below, involves being able to be dispensed from a roll and (once the device is completed) optionally be re-spooled onto a second roll. It is notable that not all ceramic substrates are flexible. By flexible it is meant herein that a body has sufficient flexibility and strength to permit its bending without breakage in at least one direction with a radius of curvature of at least 1 meter (m), preferably at least 0.2 m. See, for example, U.S. Pat. No. 5,089,455 issued to Ketcham et al., entitled "Thin Flexible Sintered Structures" (hereinafter "U.S. Pat. No. 5,089,455"), the contents of which are incorporated by reference as if fully set forth herein. For instance, the present ceramic substrate has to be thin enough to flex. Further, it is important that, when flexed, the present ceramic substrate is durable and does not break. Thus, to be considered flexible in accordance with the present techniques, the ceramic substrate needs to be easily bendable (e.g., to the above-described radius of curvature) without breaking.

The term "kesterite," as used herein, refers to a material containing copper (Cu), zinc (Zn), tin (Sn) and at least one of sulfur (S) and selenium (Se) (also abbreviated herein as "CZT(S/Se)"—wherein the designation S/Se denotes that S and/or Se may be present). Preferably, the kesterite materials provided herein contain both S and Se (i.e., the present kesterite materials are sulfo-selenides). For instance, according to an exemplary embodiment, the S to Se composition of the sample is from about 96% S (and 4% Se) to about 96% Se (and 4% S), and ranges therebetween.

The term "roll-to-roll" (or sometimes "reel-to-reel" manufacturing—both abbreviated herein generally as "R2R" manufacturing), as used herein, refers to a manufacturing process using a flexible material that is dispensed continuously from a first roll (or reel), processed, and then re-wound onto a second roll (or reel) and/or cut-up into discrete sections for use. More specifically, according to the present techniques, the flexible material dispensed from the roll (or reel) is a flexible ceramic substrate material on which the various layers of a photovoltaic device will be formed. One of the layers contains the above kesterite material which serves as an absorber layer of the device. The terms "roll" and "reel" are being used interchangeably herein.

As will be described in detail below, once processed with the various layers of the device, the flexible ceramic substrate material may be re-wound onto a second roll for later processing into discrete device units. For instance, the dimensions of the final photovoltaic device may vary depending on the particular application at hand. Thus, cutting-up of devices from the (completed) roll may be performed as needed. However, once processed, rather than re-winding the finished product onto a second roll it may instead be immediately cut-up into discrete sections. This alternative configuration is also generally considered herein as R2R manufacturing even though a second (take up) roll is not implemented.

Figure 1:
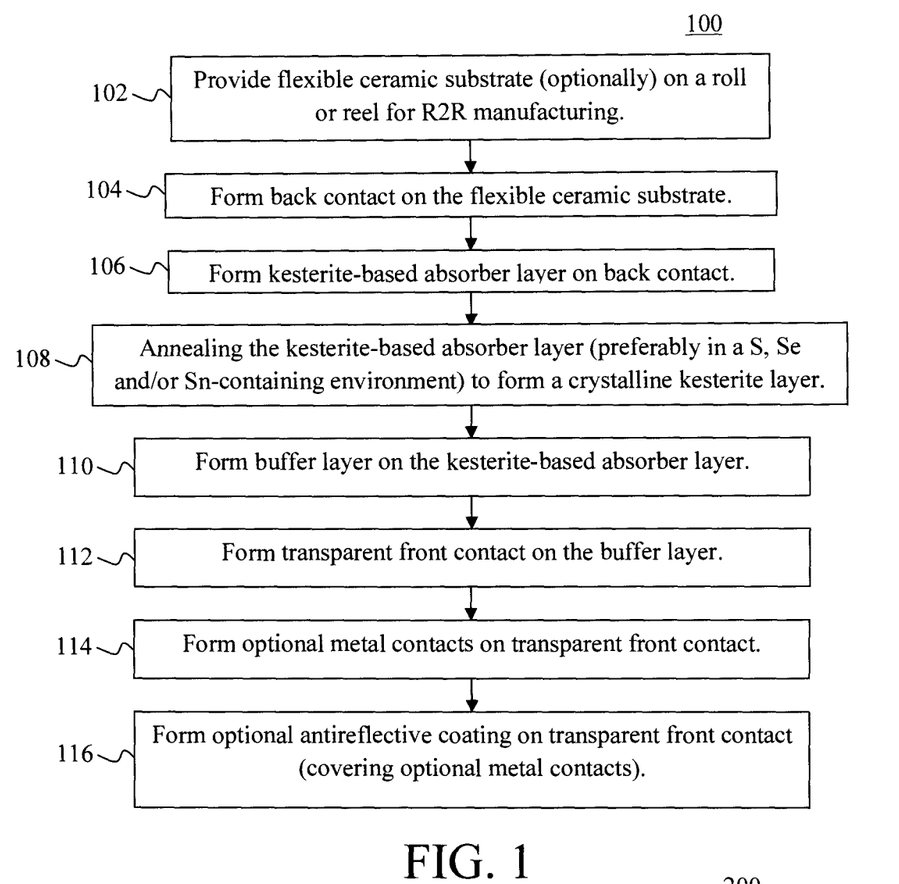
FIG. 1 is a diagram illustrating an exemplary methodology for forming a kesterite-based photovoltaic device on a flexible ceramic substrate according to an embodiment of the present invention.

An overview of the present techniques is now provided by way of reference to methodology 100 of FIG. 1 for forming a flexible kesterite-based photovoltaic device on a flexible ceramic substrate. In step 102, the flexible ceramic substrate is provided. Suitable flexible ceramic substrates include, but are not limited to, substrates formed from at least one of zirconia (zirconium oxide ($ZrO_2$)), yttrium-stabilized zirconia, alumina (aluminum oxide ($Al_2O_3$)), and titania (titanium dioxide ($TiO_2$)). More generally however, substrates formed from any fully crystalline or partially vitreous oxide material (other than glass) would be suitable in accordance with the present techniques as long as they are flexible. See below. By way of example only, the flexible ceramic substrate has a thickness of from about 30 micrometers ($\mu m$) to about 50 $\mu m$, and ranges therebetween.

By way of example only, flexible ceramic substrates (and methods for formation thereof) suitable for use in accordance with the present techniques are described, e.g., in U.S. Pat. No. 5,089,455, in U.S. Pat. No. 5,273,837 issued to Aitken et al., entitled "Solid Electrolyte Fuel Cells" (hereinafter "U.S. Pat. No. 5,273,837"), and in U.S. Patent Application Publication Number 2004/0265663 filed by Badding et al., entitled "Textured Electrolyte Sheet" (hereinafter "U.S. Patent Application Publication Number 2004/0265663"). The contents of each of the foregoing patents and patent application are incorporated by reference as if fully set forth herein. For example, as described in U.S. Pat. No. 5,089,455 extrusion, tape casting, etc. are used to form a plastic batch containing a selective combination of materials including zirconias, aluminas, titanias, silicas (including zirconates, aluminates, titanates and silicates), rare earth metals and/or their oxides, alkalis and alkaline earth metals, and/or their oxides, steels, stainless steels, aluminides, intermetallics, aluminum and its alloys, the first, second, and third transition series of metals, their oxides, borides, nitrides, carbides, silicides, and/or combinations thereof. The material is then formed into an elongated body of any desired cross-sectional shape, and sintered. U.S. Pat. No. 5,273,837 describes strong but flexible pre-sintered ceramic sheets (e.g., with a thickness not exceeding about 45 micrometers) having polycrystalline zirconium oxide as a component thereof. By way of example only, these flexible pre-sintered ceramic sheets may be formed by drawing continuous lengths of green sheet through a sintering furnace. The textured sheets described in U.S. Patent Application Publication Number 2004/0265663 have uniform flexing capability with an average thickness of greater than 5 micrometers and less than 100 micrometers. The material may be formed of a polycrystalline ceramic selected from the group comprising of partially stabilized zirconia or stabilized zirconia, the partially stabilized, or stabilized zirconia being doped with a dopant selected from the group comprising of the oxides of Y, Ce, Ca, Mg, Sc, Nd, Sm, Eu, Gd, Tb, Dy, Ho, Er, Tm, Yb, Lu, In, Ti, Sn, Nb, Ta, Mo, W and mixtures thereof. According to U.S. Patent Application Publication Number 2004/0265663, thin sheets of the material can be formed in the green state in a molded configuration and subsequently sintered to form an electrolyte sheet with a large measure of flexibility.

According to an exemplary embodiment, methodology 100 is (optionally) performed using R2R manufacturing, and the flexible ceramic substrate material is dispensed from a roll. As provided above, R2R manufacturing and processing is one notable advantage of employing a flexible substrate material. R2R manufacturing capabilities are especially advantageous in the context of photovoltaic device production. Specifically, the wide-scale implementation of solar technology has to-date been hampered largely by the overall manufacturing costs. The cost savings from R2R manufacturing as compared to traditional photovoltaic device fabrication processes is significant as it greatly increases manufacturing throughput and product output, and decreases the amount of handling for each device produced. Thus, an effective R2R process for manufacturing increased efficiency photovoltaic devices would significantly increase the viability of this technology for wide-scale manufacture and use. It is further notable that, even if the present techniques are implemented without R2R processing, the advantages of the present techniques are evident. For example, the kesterite and flexible substrate materials described herein yield higher efficiency devices than those shown through conventional processes. One reason for this advantage is that the present flexible ceramic substrate materials are able to withstand higher processing temperatures (as compared, e.g., to traditionally implemented glass substrates). Further, due to the weight savings and durability of the present flexible ceramic substrates (e.g., as opposed to traditional glass substrates), the resulting devices are lighter weight and more durable, and thus suitable for a broader range of applications, such as for devices which are meant to be mobile/transport-able, for use in harsh conditions, etc.

In step 104, a back contact is formed on the flexible ceramic substrate. According to an exemplary embodiment, the back contact is formed from a conductive layer such as a conductive metal layer. By way of example only, the conductive metal layer is formed from molybdenum (Mo), nickel (Ni), tantalum (Ta), tungsten (W), aluminum (Al), platinum (Pt), and/or titanium (Ti). Preferably, the conductive metal layer is formed from Mo. The back contact may be formed on the flexible ceramic substrate using a deposition process such as evaporation or sputtering. As will be described in detail below, in the exemplary embodiment wherein methodology 100 is performed using R2R manufacturing—as the flexible ceramic substrate is un-spooled (from a roll) and fed through the (R2R) processing apparatus the first component deposited onto the flexible ceramic substrate is the back contact material.

In step 106, a kesterite absorber layer is formed on a side of the back contact opposite the flexible ceramic substrate. As provided above, the present kesterite absorber is a CZT(S/Se) material that preferably contains both S and Se (i.e., the kesterite is a sulfo-selenide). The kesterite absorber layer may be formed on the back contact using an ink-based, atmospheric pressure vapor-based, vacuum-based, or bath-based deposition technique.

Suitable ink-based deposition techniques for kesterite materials are described, for example, in U.S. Patent Application Publication Number 2014/0096826 by Teodor K. Todorov, entitled "Solution Processing of Kesterite Semiconductors" (hereinafter "U.S. Patent Application Publication Number 2014/0096826") the contents of which are incorporated by reference as if fully set forth herein. In U.S. Patent Application Publication Number 2014/0096826 kesterite component sources are combined in a hydrazine solution to form a deposition ink, which can be cast using spin-coating.

Suitable vapor-based deposition techniques for kesterite materials are described, for example, in U.S. Patent Application Publication Number 2012/0100663 by Bojarczuk et al., entitled "Fabrication of CuZnSn(S,Se) Thin Film Solar Cell with Valve Controlled S and Se" (hereinafter "U.S. Patent Application Publication Number 2012/0100663"), the contents of which are incorporated by reference as if fully set forth herein. According to U.S. Patent Application Publication Number 2012/0100663, the sources for one or more components of the kesterite absorber are placed in a vapor chamber along with the substrate, and thermal evaporation is used to (co-evaporate) the components onto the substrate. Advantageously, U.S. Patent Application Publication Number 2012/0100663 provides techniques for precisely regulating the S to Se ratio in the material (by introducing the S and Se to the vapor chamber from individual S and Se cracking cells. Being able to regulate the S to Se ratio is important in terms of band gap tuning and/or band gap grading. See, for example, U.S. patent Ser. No. 14/499,116, designated as Attorney Docket Number YOR920140147US1, by Mahajan et al., entitled "Anneal Techniques for Chalcogenide Semiconductors," the contents of which are incorporated by reference as if fully set forth herein.

Suitable vacuum-based deposition techniques for kesterite materials are described, for example, in Katagiri et al., "Development of CZTS-based thin film solar cells," Thin Solid Films, Vol. 517, Issue 7, pgs. 2455-2460 (February 2009) (hereinafter "Katagiri"), the contents of which are incorporated by reference as if fully set forth herein. According to Katagiri, CZTS films were grown by vacuum co-evaporation using elemental copper, tin and sulfur sources, and a binary zinc sulfide source.

Suitable electrodeposition (bath-based) deposition techniques are described, for example, in U.S. Patent Application Publication Number 2012/0061790 by Ahmed et al., entitled "Structure and Method of Fabricating a CZTS Photovoltaic Device by Electrodeposition" (hereinafter "U.S. Patent Application Publication Number 2012/0061790"), the contents of which are incorporated by reference as if fully set forth herein. According to U.S. Patent Application Publication Number 2012/0061790 a CZTS absorber layer is formed as a metal stack on a substrate using electrodeposition from an electroplating solution. The sequence of the layers in the stack may be configured so as to achieve optimal band grading and/or adhesion to the substrate, as is known in the art. See, for example, Dullweber et al., "Back surface band gap gradings in $Cu(In,Ga)Se_2$ solar cells," Thin Solid Films, vol. 387, 11-13 (May 2001), the contents of which are incorporated by reference as if fully set forth herein.

As will be described in detail below, in the exemplary embodiment wherein methodology 100 is performed using R2R manufacturing—as the flexible ceramic substrate is un-spooled (from a roll) and fed through the (R2R) processing apparatus the kesterite absorber layer will be the second component deposited onto the flexible ceramic substrate, i.e., the kesterite absorber layer will be deposited onto the (first component) back contact. Specifically, as the continuous sheet of the flexible ceramic substrate passes through the R2R processing apparatus the back contact is first deposited thereon. The flexible ceramic substrate with the back contact then passes through another stage of the R2R processing apparatus where the kesterite absorber layer is formed on the back contact.

In step 108, the kesterite absorber layer is then annealed to form a crystalline kesterite layer. According to an exemplary embodiment, the kesterite absorber layer is annealed in step 108 at a temperature of greater than about 500° C., e.g., from about 540° C. to about 650° C., and ranges therebetween, for a duration of from about 1 second to about 24 hours, and ranges therebetween. Preferably, this annealing is performed in a chalcogen environment. The term "chalcogen" refers generally to elements in group 16 of the periodic table of elements. However, the chalcogens of particular relevance to kesterite materials include S and Se. Namely, the as-deposited materials have poor grain structure and a lot of defects. An anneal in the chalcogen environment improves the grain structure and defect landscape in the material. Further, in addition to S and Se, the present kesterite absorber materials include other volatile components such as Sn. The volatile nature of Sn at temperatures commonly employed during processing make the precise composition of the material difficult to control. Namely, when kesterite samples are heated above 400° C., reevaporation of Sn occurs causing desorption and loss of Sn from the samples. See, for example, Mitzi et al., "The path towards a high-performance solution-processed kesterite solar cell," Solar Energy Materials & Solar Cells 95 (June 2011) 1421-1436, the contents of which are incorporated by reference as if fully set forth herein. It is notable that the Sn lost due to desorption is however generally not elemental Sn, but occurs primarily in the form of tin sulfide (SnS). See, for example, A. Weber et al., "On the Sn loss from thin films of the material system Cu—Zn—Sn—S in high vacuum," Journal of Applied Physics 107, 013516 (January 2010) (hereinafter "Weber"), the contents of which are incorporated by reference as if fully set forth herein. Carrying out high temperature anneals (even at temperatures of 550° C. or above) in a sulfur environment (e.g., $H_2S$) can thus mitigate the loss of Sn. See Weber. Thus, the anneal performed in step 108 may be conducted in a S, Se and/or Sn-containing environment.

As will be described in detail below, in the exemplary embodiment wherein methodology 100 is performed using R2R manufacturing the continuous sheet of the flexible ceramic substrate with the kesterite absorber layer (and back contact) deposited thereon as it passes through the R2R processing apparatus next passes under a heating element(s) configured to heat the kesterite absorber layer to the above-prescribed temperatures. Suitable heating elements may, for example, be infrared (IR), laser and/or flash annealing heating elements. As provided above, this heating/annealing of the kesterite absorber layer may be performed in a chalcogen environment. In the context of R2R manufacturing this chalcogen environment can be provided either uniformly in the processing environment or preferably varied in one or more different zones of the process, wherein each zone is created and separated from the others with a series of baffles and inert and/or reactive gas curtains. See, for example, European Patent Application Number EP 2557198 by Knaapen et al., entitled "Method and apparatus for depositing atomic layers on a substrate" (hereinafter "European Patent Application Number EP 2557198") the contents of which are incorporated by reference as if fully set forth herein, which describes use of, e.g., a purge gas, as a gas curtain to prevent a precursor gas from escaping.

In step 110, a buffer layer is formed on a side of the kesterite absorber layer opposite the back contact. According to an exemplary embodiment, the buffer layer is formed from at least one of cadmium sulfide (CdS), a cadmium-zinc-sulfur material of the formula $Cd_{1-x}Zn_xS$ (wherein $0<x\le 1$), indium sulfide ($In_2S_3$), zinc oxide, zinc oxysulfide (e.g., a Zn(O,S) or Zn(O,S,OH) material), and aluminum oxide ($Al_2O_3$). The buffer layer may be formed on the kesterite absorber layer using a deposition process such as standard chemical bath deposition. According to an exemplary embodiment, the buffer layer is formed having a thickness of from about 50 angstroms (Å) to about 1,000 Å, and ranges therebetween. The buffer layer and the kesterite absorber layer form a p-n junction therebetween.

As will be described in detail below, in the exemplary embodiment wherein methodology 100 is performed using R2R manufacturing—as the flexible ceramic substrate is un-spooled (from a roll) and fed through the (R2R) processing apparatus the buffer layer will be the third component deposited onto the flexible ceramic substrate, i.e., the buffer layer will be deposited onto the (second component) kesterite absorber layer which is already present on the (first component) back contact. Specifically, as the continuous sheet of the flexible ceramic substrate passes through the R2R processing apparatus the back contact is first deposited thereon followed by the kesterite absorber layer. See above. The flexible ceramic substrate with the back contact material and kesterite absorber layer then passes through another stage of the R2R processing apparatus where the buffer layer is formed on the kesterite absorber layer.

In step 112, a transparent front contact is formed on a side of the buffer layer opposite the kesterite absorber layer. According to an exemplary embodiment, the transparent front contact is formed from a transparent conductive oxide (TCO) such as indium-tin-oxide (ITO) and/or aluminum (Al)-doped zinc oxide (ZnO) (AZO)). The transparent front contact may be formed on the buffer layer using a deposition process such as sputtering.

As will be described in detail below, in the exemplary embodiment wherein methodology 100 is performed using R2R manufacturing—as the flexible ceramic substrate is un-spooled (from a roll) and fed through the (R2R) processing apparatus the transparent front contact will be the fourth component deposited onto the flexible ceramic substrate, i.e., the transparent front contact will be deposited onto the (third component) buffer layer which is already present on the (second component) kesterite absorber layer and the (first component) back contact. Specifically, as the continuous sheet of the flexible ceramic substrate passes through the R2R processing apparatus the back contact is first deposited thereon followed by the kesterite absorber layer and then the buffer layer. See above. The flexible ceramic substrate with the back contact, kesterite absorber layer, and buffer layer then passes through another stage of the R2R processing apparatus where the transparent front contact is formed on the buffer layer.

The structure now is a functioning device and may be considered complete at this point. However, additional processing may be performed and/or additional structures, layers, etc. may be formed if so desired. For example, in step 114 metal contacts may be formed on a side of the transparent front contact opposite the buffer layer. According to an exemplary embodiment, the metal contacts are formed from aluminum (Al) and/or nickel (Ni). The metal contacts may be formed on the transparent front contact using a process such as electron-beam evaporation.

As will be described in detail below, in the exemplary embodiment wherein methodology 100 is performed using R2R manufacturing—as the flexible ceramic substrate is un-spooled (from a roll) and fed through the (R2R) processing apparatus the metal contacts (if present) will be the fifth component deposited onto the flexible ceramic substrate, i.e., the metal contacts will be deposited onto the (fourth component) transparent front contact which is already present on the (third component) buffer layer, the (second component) kesterite absorber layer and the (first component) back contact. Specifically, as the continuous sheet of the flexible ceramic substrate passes through the R2R processing apparatus the back contact is first deposited thereon followed by the kesterite absorber layer, the buffer layer, and then the transparent front contact. See above. The flexible ceramic substrate with the back contact, kesterite absorber layer, buffer layer, and transparent front contact then passes through another stage of the R2R processing apparatus where the metal contacts are formed on the transparent front contact.

Another optional component of the device is an antireflective coating. For example, in step 116 an antireflective coating may be formed on a side of the transparent front contact opposite the buffer layer (covering the optional metal contacts). According to an exemplary embodiment, the antireflective coating is formed from magnesium oxide (MgO) or magnesium fluoride ($MgF_2$). The antireflective coating may be formed on the transparent front contact (and covering the optional metal contacts) using a process such as electron-beam evaporation.

As will be described in detail below, in the exemplary embodiment wherein methodology 100 is performed using R2R manufacturing—as the flexible ceramic substrate is un-spooled (from a roll) and fed through the (R2R) processing apparatus the antireflective coating (if present) will be the sixth component deposited onto the flexible ceramic substrate, i.e., the antireflective coating will be deposited onto the (fifth component) metal contacts—if present—and the (fourth component) transparent front contact which is already present on the (third component) buffer layer, the (second component) kesterite absorber layer and the (first component) back contact. Specifically, as the continuous sheet of the flexible ceramic substrate passes through the R2R processing apparatus the back contact is first deposited thereon followed by the kesterite absorber layer, the buffer layer, the transparent front contact, and then the (optional) metal contacts. See above. The flexible ceramic substrate with the back contact, kesterite absorber layer, buffer layer, transparent front contact, and (optional) metal contacts then passes through another stage of the R2R processing apparatus where the antireflective coating is formed on the transparent front contact (and covering the optional metal contacts).

Figure 2:
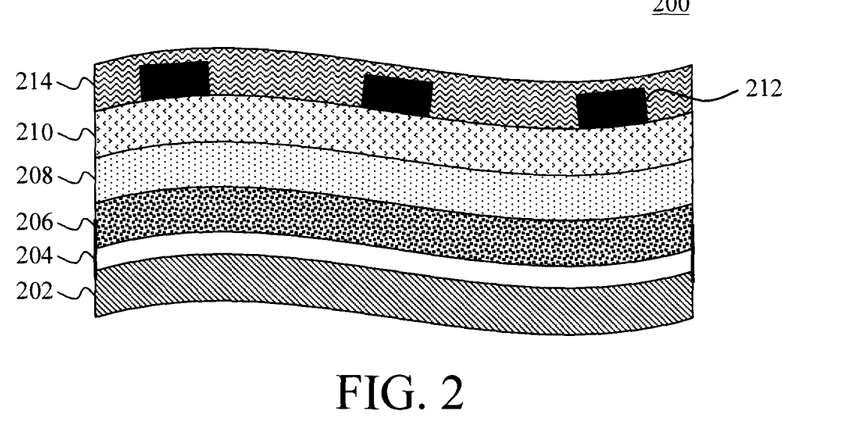
FIG. 2 is a cross-sectional diagram illustrating an exemplary kesterite-based photovoltaic device formed in accordance with the method of FIG. 1 according to an embodiment of the present invention.

FIG. 2 is a diagram illustrating an exemplary kesterite photovoltaic device 200 formed according to methodology 100 above. As shown in FIG. 2, photovoltaic device 200 is formed on a flexible substrate and thus the device itself is flexible. It is further notable that while FIG. 2 depicts photovoltaic device 200 as a discrete device unit, the present R2R manufacturing capabilities would produce a photovoltaic device 200 as a continuous sheet which can be cut-up into discrete device units (such as that shown in FIG. 2). Alternatively, if so desired, rather than employing R2R manufacturing, photovoltaic device 200 may be produced starting with individual wafers of the present flexible substrate material (as opposed to continuous sheets). As provided above, in addition to R2R manufacturing capabilities, the present flexible substrate materials also have the advantages of lighter weight and greater heat resistance as compared to traditional glass substrates.

As shown in FIG. 2, photovoltaic device 200 includes a flexible ceramic substrate 202, a back contact 204 on the flexible ceramic substrate 202, a kesterite absorber layer 206 on a side of the back contact 204 opposite the flexible ceramic substrate 202, a buffer layer 208 on a side of the kesterite absorber layer 206 opposite the back contact 204, a transparent front contact 210 on a side of the buffer layer 208 opposite the kesterite absorber layer 206, optional metal contacts 212 on a side of the transparent front contact 210 opposite the buffer layer 208, and an optional antireflective coating 214 on a side of the transparent front contact 210 opposite the buffer layer 208 (and covering the optional metal contacts 212).

Suitable materials for forming the various layers of photovoltaic device 200 were provided above. For instance, flexible ceramic substrate 202 may be formed from at least one of zirconia ($ZrO_2$), yttrium-stabilized zirconia, alumina ($Al_2O_3$), and titania ($TiO_2$). More generally, substrates formed from any fully crystalline or partially vitreous oxide material (other than glass) would be suitable. By way of example only, the flexible ceramic substrate 202 has a thickness of from about 30 µm to about 50 µm, and ranges therebetween.

Back contact 204 may be formed from a conductive layer such as a conductive metal layer that includes Mo, Ni, Ta, W, Al, Pt, and/or Ti. Preferably, the back contact 204 is formed from Mo. Kesterite absorber layer 206 contains Cu, Zn, Sn, and at least one of S and Se. Preferably, the kesterite absorber layer 206 contains both S and Se (i.e., the kesterite is a sulfo-selenide). Buffer layer 208 may be formed from at least one of CdS, a cadmium-zinc-sulfur material of the formula $Cd_{1-x}Zn_xS$ (wherein $0<x\leq1$), $In_2S_3$, zinc oxide, zinc oxysulfide (e.g., a Zn(O,S) or Zn(O,S,OH) material), and $Al_2O_3$. According to an exemplary embodiment, the buffer layer 208 has a thickness of from about 50 Å to about 1,000 Å, and ranges therebetween. As noted above, the buffer layer and the kesterite absorber layer form a p-n junction therebetween. Transparent front contact 210 may be formed from a TCO such as ITO and/or Al-doped ZnO (AZO)). Metal contacts 212 may be formed from Ni and/or Al. Antireflective coating 214 may be formed from MgO or $MgF_2$.

A notable advantage of the instant techniques is that use of the present flexible ceramic substrate permits R2R manufacturing of the present kesterite-based photovoltaic device wherein a continuous sheet of the flexible ceramic substrate material is dispensed from a roll and fed through a R2R processing apparatus. An exemplary embodiment wherein methodology 100 is performed using R2R manufacturing to form, for example, photovoltaic device 200 is now described in detail by way of reference to FIGS. 3-9. For consistency, the reference numerals from FIG. 2 will be used here as well to refer to the same layers of the photovoltaic device.

Figure 3:
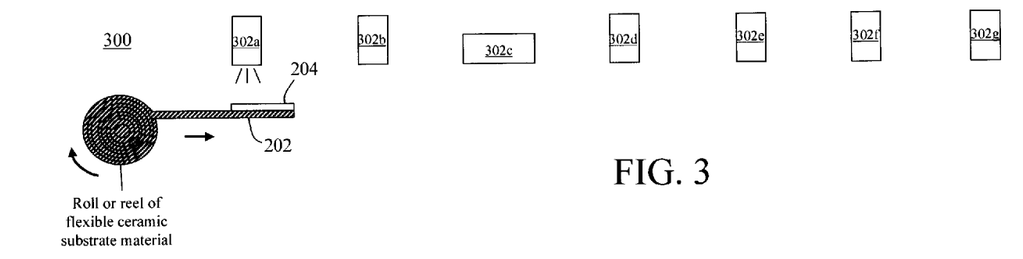
FIG. 3 is a schematic diagram illustrating a roll-to-roll (R2R) processing apparatus being used to form a back contact on a flexible ceramic substrate according to an embodiment of the present invention.

The R2R processing apparatus 300 shown illustrated in FIGS. 3-9 contains multiple processing stages, or simply stages. For instance, as shown in FIG. 3 exemplary R2R processing apparatus 300 includes 7 stages 302a-g. As will be described in detail below, the first stage 302a is configured to deposit the back contact 204 onto the flexible ceramic substrate 202 (see FIG. 3). The second stage 302b is configured to deposit the kesterite absorber layer 206 onto the back contact 204 (see FIG. 4). The third stage 302c is configured to heat/anneal the kesterite absorber layer 206 (see FIG. 5). The fourth stage 302d is configured to deposit the buffer layer 208 on the kesterite absorber layer 206 (see FIG. 6). The fifth stage 302e is configured to deposit the transparent front contact 210 onto the buffer layer 208 (see FIG. 7). The sixth stage 302f is configured to deposit the metal contacts 212 onto the transparent front contact 210 (see FIG. 8). The seventh stage 302g is configured to deposit the antireflective coating 214 onto the transparent front contact 210 (and covering the optional metal contacts) (See FIG. 9). These various layers of the photovoltaic device are formed/processed continuously as a continuous sheet of the flexible ceramic substrate is passed through each of the stages. Arrows are used in FIGS. 3-9 to indicate the direction of movement of the flexible ceramic substrate 202 as it passes through the R2R processing apparatus 300. It is notable that FIGS. 3-9 show the R2R processing as occurring in a linear manner where the flexible ceramic substrate is fed in a straight line through the various processing stages. This representation is used merely for ease and clarity of depiction. Namely, as known to those of skill in the art, R2R manufacturing may, depending on the configuration of a particular R2R apparatus, involve routing the product through a variety of different loops and turns (typically via additional sets of rollers not depicted in the figures). The overall principles and techniques described herein are however the same, and thus the present techniques are generally applicable to a variety of different R2R manufacturing configurations.

Figure 10:
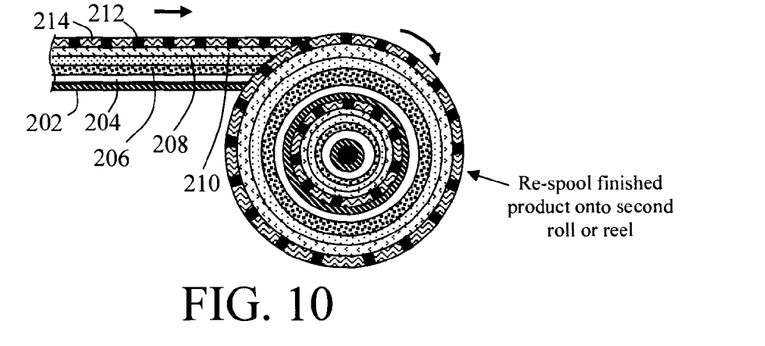
FIG. 10 is a schematic diagram illustrating how the finished product from the R2R processing apparatus can be re-wound onto a second roll according to an embodiment of the present invention.
Figure 11:
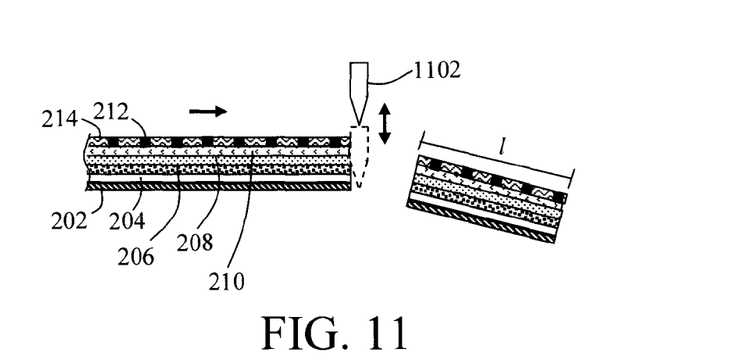
FIG. 11 is a schematic diagram illustrating how the finished product from the R2R processing apparatus can be cut-up into individual sections according to an embodiment of the present invention.

The flexible ceramic substrate 202 is fed continuously to the R2R processing apparatus from a roll of the flexible ceramic substrate material. An arrow is used to indicate the direction the roll turns as the flexible ceramic substrate material is dispensed therefrom. As shown in FIG. 10, and as will be described in detail below, once the completed device passes through the final stage, the finished product can be re-wound onto a second roll. This process is what is being referred to herein as roll-to-roll/reel-to-reel (R2R) manufacturing. This R2R capability is based on the flexibility of the substrate material and end-product device. Alternatively, as shown in FIG. 11, as the completed device exits the final stage it may be immediately cut-up into individual sections (of any desired length l).

As shown in FIG. 3, as the flexible ceramic substrate 202 is un-wound (from the roll) and fed through R2R processing apparatus 300 the first component deposited onto the flexible ceramic substrate 202 is the back contact 204. As provided above, the back contact 204 may be deposited onto the flexible ceramic substrate 202 using a process such as evaporation or sputtering which, according to this particular exemplary embodiment, occurs at the first stage 302a of the R2R processing apparatus 300. The application of the back contact 204 at this first stage is depicted schematically in FIG. 3 at stage 302a with the understanding that various techniques are known in the art for evaporation or sputtering in accordance with a R2R manufacturing process.

For instance, a R2R evaporation process is described, for example, in Patchett et al., "A high-yield vacuum-evaporation-based R2R-compatible fabrication route for organic electronic circuits," Organic Electronics, vol. 15, issue 7 pgs. 1493-1502 (July 2014) (hereinafter "Patchett"), the contents of which are incorporated by reference as if fully set forth herein. However, a reduced pressure atmosphere is needed which is challenging to apply to a continuous line processing across multiple stages with different deposition techniques and conditions. R2R sputtering techniques are easier to implement.

As shown in FIGS. 3-9, the formation of the back contact 204 on the flexible ceramic substrate 202 occurs continuously as the flexible ceramic substrate 202 passes through the first stage of the R2R processing apparatus 300. Thus, the back contact 204 is formed as a continuous layer on the flexible ceramic substrate 202.

Figure 4:
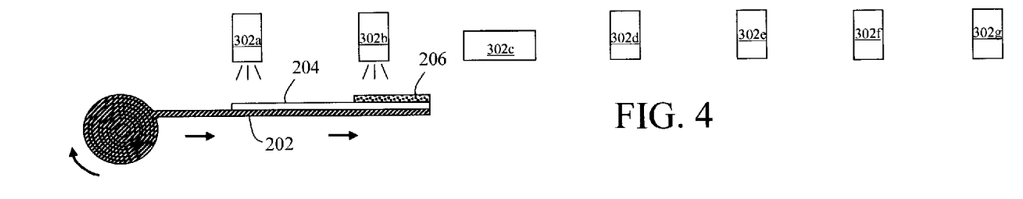
FIG. 4 is a schematic diagram illustrating the R2R processing apparatus being used to form a kesterite absorber layer on the back contact according to an embodiment of the present invention.

Next, as shown in FIG. 4, as the flexible ceramic substrate 202 is fed through R2R processing apparatus 300 the kesterite absorber layer 206 is the second component deposited onto the flexible ceramic substrate 202, i.e., the kesterite absorber layer 206 will be deposited onto the (first component) back contact 204. Specifically, as the continuous sheet of the flexible ceramic substrate 202 passes through the R2R processing apparatus 300 the back contact 204 is first deposited thereon. The flexible ceramic substrate 202 with the back contact 204 then passes through another stage of the R2R processing apparatus 300 where the kesterite absorber layer 206 is formed on a side of the back contact 204 opposite the flexible ceramic substrate 202.

As provided above, the kesterite absorber layer 206 may be deposited onto the flexible ceramic substrate 202 using an ink-based, atmospheric pressure vapor-based, vacuum-based, or bath-based deposition technique which, according to this particular exemplary embodiment, occurs at the second stage 302b of the R2R processing apparatus 300. The application of the kesterite absorber layer 206 at this second stage is depicted schematically in FIG. 4 at stage 302b with the understanding that various techniques are known in the art for ink-based, atmospheric pressure vapor-based, vacuum-based, or bath-based deposition techniques in accordance with a R2R manufacturing process.

For instance, the use of nanoparticle inks and electroplating from plating baths in R2R manufacturing are described, for example, in Morse et al., "Nanofabrication Technologies for Roll-to-Roll Processing," Report from the NIST-NNN Workshop, Sep. 27-28, 2011 (hereinafter "Morse"), the contents of which are incorporated by reference as if fully set forth herein. As provided above, while a vacuum-based R2R apparatus is possible (see, for example, Patchett) a reduced pressure atmosphere is needed which is challenging to apply to a continuous line processing across multiple stages with different deposition techniques and conditions.

As shown in FIGS. 3-9, the formation of the kesterite absorber layer 206 on the back contact 204 occurs continuously as the flexible ceramic substrate 202 passes through the second stage of the R2R processing apparatus 300. Thus, the kesterite absorber layer 206 is formed as a continuous layer on the back contact 204.

Figure 5:
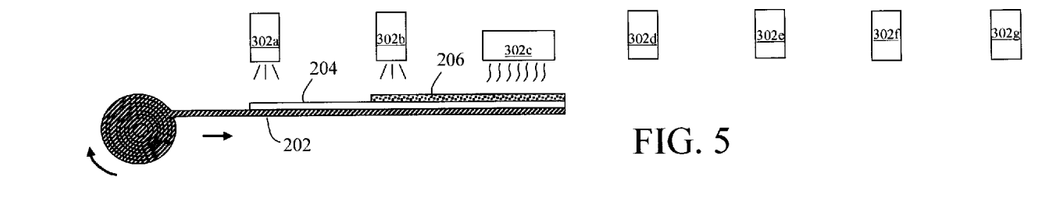
FIG. 5 is a schematic diagram illustrating the R2R processing apparatus being used to heat the kesterite absorber layer according to an embodiment of the present invention.

As shown in FIG. 5, the continuous sheet of the flexible ceramic substrate 202 with the kesterite absorber layer 206 (and back contact 204) deposited thereon as it passes through the R2R processing apparatus 300 next passes under a heating element configured to heat the kesterite absorber layer to the above-prescribed temperature (e.g., to a temperature of greater than about 500° C., e.g., from about 540° C. to about 650° C., and ranges therebetween). As provided above, this heating/annealing of the kesterite absorber layer may be performed in a chalcogen environment. In the context of R2R manufacturing this chalcogen environment can be provided either uniformly in the processing environment or preferably varied in one or more different zones of the process, wherein each zone is created and separated from the others with a series of baffles and inert and/or reactive gas curtains. See, for example, European Patent Application Number EP 2557198.

Figure 12:
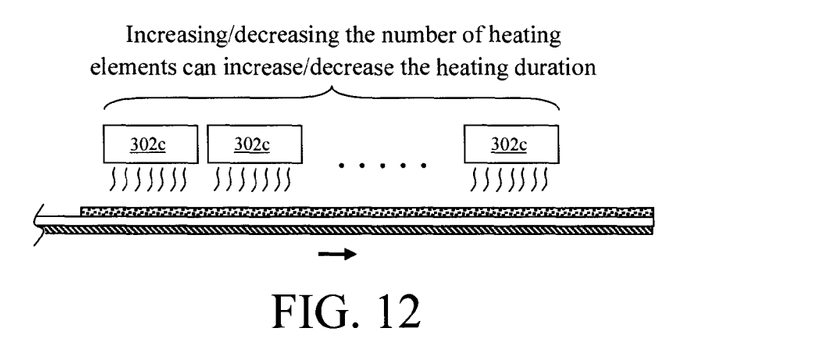
FIG. 12 is a schematic diagram illustrating multiple heating elements being employed in the third stage of the R2R processing apparatus and how increasing or decreasing the number of heating elements increases or decreases the heating duration according to an embodiment of the present invention.

It is notable that, as described in accordance with the description of step 108 of methodology 100 of FIG. 1 above, this heating is performed for an exemplary duration of from about 1 second to about 24 hours, and ranges therebetween. The speed with which the continuous sheet of the flexible ceramic substrate 202 (with the kesterite absorber layer 206 and back contact 204 deposited thereon) can be regulated in order to achieve a desired processing duration (in this case a desired duration for the heating) in the present R2R manufacturing apparatus. By way of example only, by reducing the speed with which the continuous sheet of the flexible ceramic substrate 202 is passed under the heating element the heating duration is increased. Conversely, increasing the speed with which the continuous sheet of the flexible ceramic substrate 202 is passed under the heating element decreases the heating duration. However, since the R2R processing apparatus 300 in this example is being used to fabricate the photovoltaic device 200 in a continuous line process, the speed at which the continuous sheet of the flexible ceramic substrate 202 is fed through the R2R processing apparatus 300 will also affect the actions being performed at the other stages. For instance, reducing the speed with which the continuous sheet of the flexible ceramic substrate 202 is fed through R2R processing apparatus 300 can increase the amount of material deposited onto the substrate at one or more of the other stages, and vice versa. Thus, in order to achieve a desired processing speed through each of the stages it may be necessary to increase the size of the heating stage, e.g., by including larger and/or multiple heating elements, thereby increasing the amount of time the product is exposed to the heating element(s) as it passes through R2R processing apparatus 300. An example of R2R processing apparatus 300 employing multiple heating elements is shown illustrated in FIG. 12—described below. Given the teachings provided herein, one skilled in the art would be able to adjust the speed with which the continuous sheet of the flexible ceramic substrate 202 is fed through R2R processing apparatus 300 and/or number of heating elements employed to achieve a proper amount of processing time at each stage.

As provided above, suitable heating elements may, for example, be IR, laser and/or flash annealing heating elements, all of which may be implemented in a R2R manufacturing apparatus by one skilled in the art. According to this particular exemplary embodiment, the heating occurs at the third stage 302c of the R2R processing apparatus 300. The heating of the kesterite absorber layer 206 at this third stage is depicted schematically in FIG. 5 at stage 302c which is intended to generally represent any technique known in the art for heating/annealing a product in accordance with a R2R manufacturing process.

Figure 6:
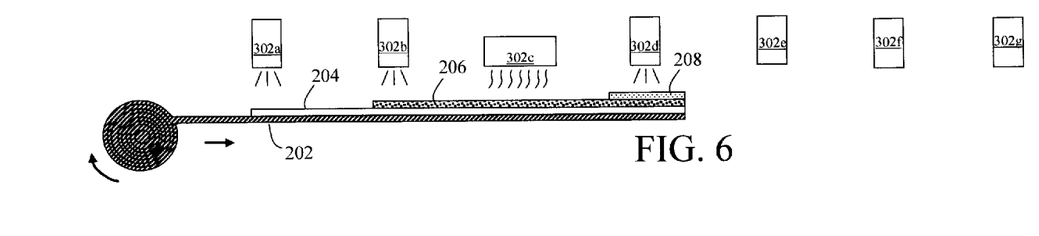
FIG. 6 is a schematic diagram illustrating the R2R processing apparatus being used to form a buffer layer on the kesterite absorber layer according to an embodiment of the present invention.

Next, as shown in FIG. 6, as the flexible ceramic substrate 202 is fed through R2R processing apparatus 300 the buffer layer 208 is the third component deposited onto the flexible ceramic substrate 202, i.e., the buffer layer 208 will be deposited onto the (second component) kesterite absorber layer 206 which is already present on the (first component) back contact 204. Specifically, as the continuous sheet of the flexible ceramic substrate 202 passes through the R2R processing apparatus 300 the back contact 204 is first deposited thereon. The flexible ceramic substrate 202 with the back contact 204 then passes through the next stage of the R2R processing apparatus 300 where the kesterite absorber layer 206 is formed on a side of the back contact 204 opposite the flexible ceramic substrate 202. The kesterite absorber layer 206 is heated, and the flexible ceramic substrate 202 with the back contact material 204 and kesterite absorber layer 206 then passes through another stage of the R2R processing apparatus 300 where the buffer layer 208 is formed on a side of the kesterite absorber layer 206 opposite the back contact 204.

As provided above, the buffer layer 208 may be deposited onto the kesterite absorber layer 206 using a chemical bath deposition technique which, according to this particular exemplary embodiment, occurs at the fourth stage 302d of the R2R processing apparatus 300. The application of the buffer layer 208 at this fourth stage is depicted schematically in FIG. 6 at stage 302d with the understanding that various techniques are known in the art for chemical bath deposition in accordance with a R2R manufacturing process. See, for example, Morse.

As shown in FIGS. 3-9, the formation of the buffer layer 208 on the kesterite absorber layer 206 occurs continuously as the flexible ceramic substrate 202 passes through the fourth stage of the R2R processing apparatus 300. Thus, the buffer layer 208 is formed as a continuous layer on the kesterite absorber layer 206.

Figure 7:
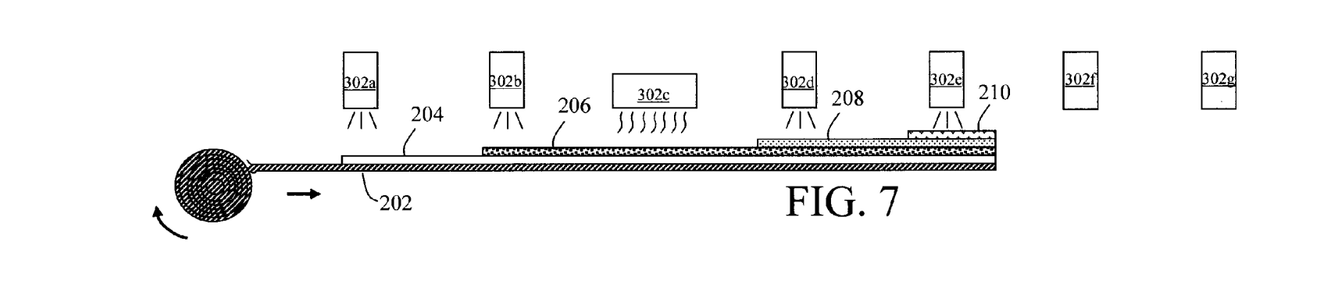
FIG. 7 is a schematic diagram illustrating the R2R processing apparatus being used to form a transparent front contact on the buffer layer according to an embodiment of the present invention.

As shown in FIG. 7, as the flexible ceramic substrate 202 is fed through R2R processing apparatus 300 the transparent front contact 210 is the fourth component deposited onto the flexible ceramic substrate 202, i.e., the transparent front contact 210 will be deposited onto the (third component) buffer layer 208 which is already present on the (second component) kesterite absorber layer 206 and the (first component) back contact 204. Specifically, as the continuous sheet of the flexible ceramic substrate 202 passes through the R2R processing apparatus 300 the back contact 204 is first deposited thereon. The flexible ceramic substrate 202 with the back contact 204 then passes through the next stage of the R2R processing apparatus 300 where the kesterite absorber layer 206 is formed on a side of the back contact 204 opposite the flexible ceramic substrate 202. The kesterite absorber layer 206 is heated, and the flexible ceramic substrate 202 with the back contact 204 and kesterite absorber layer 206 then passes through another stage of the R2R processing apparatus 300 where the buffer layer 208 is formed on a side of the kesterite absorber layer 206 opposite the back contact 204. The flexible ceramic substrate 202 with the back contact material 204, the kesterite absorber layer 206, and the buffer layer 208 then passes through another stage of the R2R processing apparatus 300 where the transparent front contact 210 is formed on a side of the buffer layer 208 opposite the kesterite absorber layer 206.

As provided above, the transparent front contact 210 may be deposited onto the buffer layer 208 using a deposition process such as sputtering which, according to this particular exemplary embodiment, occurs at the fifth stage 302e of the R2R processing apparatus 300. The application of the transparent front contact 210 at this fifth stage is depicted schematically in FIG. 7 at stage 302e with the understanding that various techniques are known in the art for sputtering in accordance with a R2R manufacturing process.

As shown in FIGS. 3-9, the formation of the transparent front contact 210 on the buffer layer 208 occurs continuously as the flexible ceramic substrate 202 passes through the fifth stage of the R2R processing apparatus 300. Thus, the transparent front contact 210 is formed as a continuous layer on the buffer layer 208.

Figure 8:
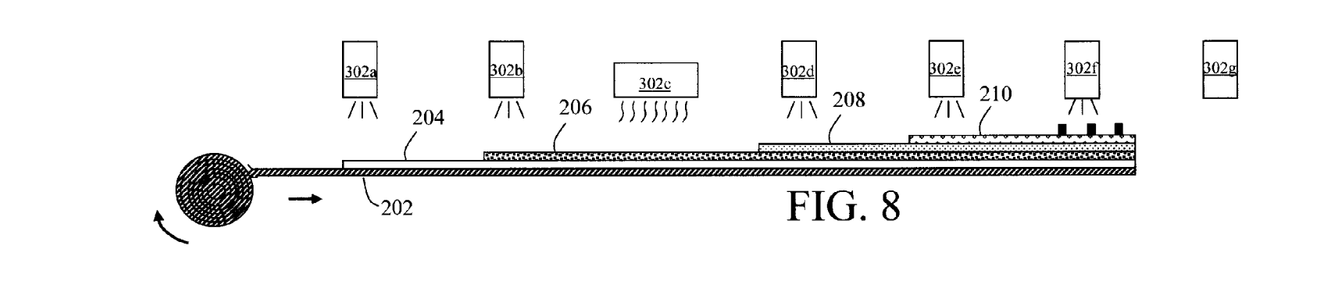
FIG. 8 is a schematic diagram illustrating the R2R processing apparatus being used to form metal contacts on the transparent front contact according to an embodiment of the present invention.

As shown in FIG. 8, as the flexible ceramic substrate 202 is fed through R2R processing apparatus 300 the metal contacts 212 are the fifth component deposited onto the flexible ceramic substrate 202, i.e., the metal contacts 212 will be deposited onto the (fourth component) transparent front contact 210 which is already present on the (third component) buffer layer 208, the (second component) kesterite absorber layer 206 and the (first component) back contact 204. Specifically, as the continuous sheet of the flexible ceramic substrate 202 passes through the R2R processing apparatus 300 the back contact 204 is first deposited thereon. The flexible ceramic substrate 202 with the back contact 204 then passes through the next stage of the R2R processing apparatus 300 where the kesterite absorber layer 206 is formed on a side of the back contact 204 opposite the flexible ceramic substrate 202. The kesterite absorber layer 206 is heated, and the flexible ceramic substrate 202 with the back contact 204 and kesterite absorber layer 206 then passes through another stage of the R2R processing apparatus 300 where the buffer layer 208 is formed on a side of the kesterite absorber layer 206 opposite the back contact 204. The flexible ceramic substrate 202 with the back contact material 204, the kesterite absorber layer 206, and the buffer layer 208 then passes through another stage of the R2R processing apparatus 300 where the transparent front contact 210 is formed on a side of the buffer layer 208 opposite the kesterite absorber layer 206. The flexible ceramic substrate 202 with the back contact material 204, the kesterite absorber layer 206, the buffer layer 208, and the transparent front contact 210 then passes through another stage of the R2R processing apparatus 300 where the metal contacts 212 are formed on a side of the transparent front contact 210 opposite the buffer layer 208.

As provided above, the metal contacts 212 may be deposited onto the transparent front contact 210 using a process such as electron-beam evaporation which, according to this particular exemplary embodiment, occurs at the sixth stage 302f of the R2R processing apparatus 300. The application of the metal contacts 212 at this sixth stage is depicted schematically in FIG. 8 at stage 302f with the understanding that various techniques are known in the art for electron-beam evaporation in accordance with a R2R manufacturing process. See, for instance, Xu et al., "Growth of textured MgO through e-beam evaporation and inclined substrate deposition," Superconductor Science and Technology, vol. 19, number 8 (July 2006) (hereinafter "Xu"), the contents of which are incorporated by reference as if fully set forth herein, which describes an R2R electron beam evaporation system. As shown in FIGS. 3-9, the formation of the metal contacts 212 on the transparent front contact 210 occurs continuously as the flexible ceramic substrate 202 passes through the sixth stage of the R2R processing apparatus 300.

Figure 9:
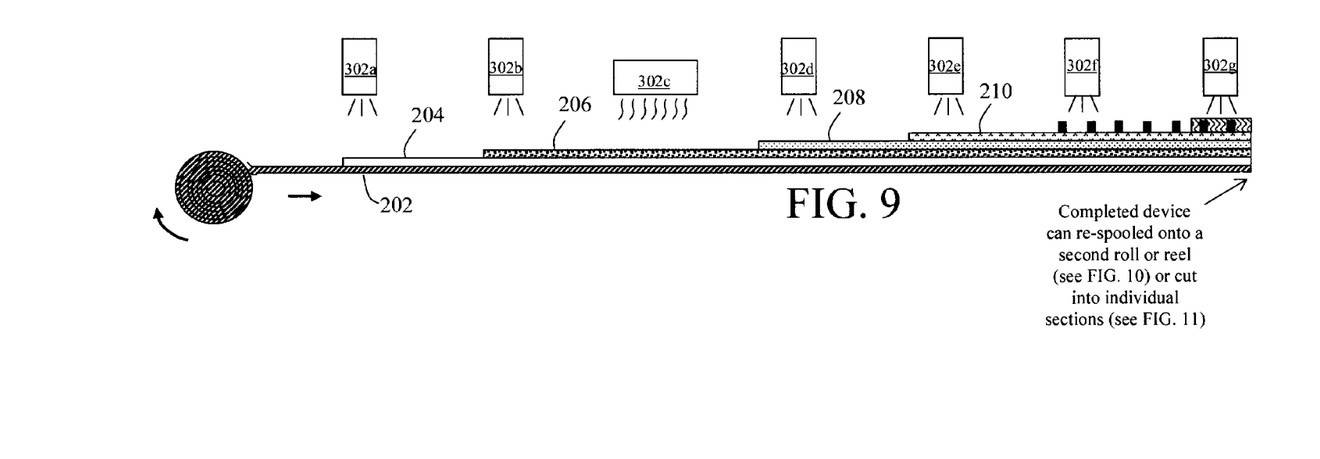
FIG. 9 is a schematic diagram illustrating the R2R processing apparatus being used to form an antireflective coating on the transparent front contact (covering the metal contacts) according to an embodiment of the present invention.

As shown in FIG. 9, as the flexible ceramic substrate 202 is fed through R2R processing apparatus 300 the antireflective coating 214 is the sixth component deposited onto the flexible ceramic substrate 202, i.e., the antireflective coating 214 will be deposited onto the (fourth component) transparent front contact 210 (covering the (fifth component) metal contacts 212) which are already present on the (third component) buffer layer 208, the (second component) kesterite absorber layer 206 and the (first component) back contact 204. Specifically, as the continuous sheet of the flexible ceramic substrate 202 passes through the R2R processing apparatus 300 the back contact 204 is first deposited thereon. The flexible ceramic substrate 202 with the back contact 204 then passes through the next stage of the R2R processing apparatus 300 where the kesterite absorber layer 206 is formed on a side of the back contact 204 opposite the flexible ceramic substrate 202. The kesterite absorber layer 206 is heated, and the flexible ceramic substrate 202 with the back contact 204 and kesterite absorber layer 206 then passes through another stage of the R2R processing apparatus 300 where the buffer layer 208 is formed on a side of the kesterite absorber layer 206 opposite the back contact 204. The flexible ceramic substrate 202 with the back contact material 204, the kesterite absorber layer 206, and the buffer layer 208 then passes through another stage of the R2R processing apparatus 300 where the transparent front contact 210 is formed on a side of the buffer layer 208 opposite the kesterite absorber layer 206. The flexible ceramic substrate 202 with the back contact material 204, the kesterite absorber layer 206, the buffer layer 208, and the transparent front contact 210 then passes through another stage of the R2R processing apparatus 300 where the metal contacts 212 are formed on a side of the transparent front contact 210 opposite the buffer layer 208. The flexible ceramic substrate 202 with the back contact material 204, the kesterite absorber layer 206, the buffer layer 208, the transparent front contact 210, and the metal contacts 212 then passes through yet another stage of the R2R processing apparatus 300 where the antireflective coating 214 is formed on a side of the transparent front contact 210 opposite the buffer layer 208 (covering the metal contacts 212).

As provided above, the antireflective coating 214 may be deposited onto the transparent front contact 210 using a process such as electron-beam evaporation which, according to this particular exemplary embodiment, occurs at the seventh stage 302g of the R2R processing apparatus 300. The application of the antireflective coating 214 at this sixth stage is depicted schematically in FIG. 9 at stage 302g with the understanding that various techniques are known in the art for electron-beam evaporation in accordance with a R2R manufacturing process. See, for instance, Xu. As shown in FIGS. 3-9, the formation of the antireflective coating 214 on the transparent front contact 210 occurs continuously as the flexible ceramic substrate 202 passes through the seventh stage of the R2R processing apparatus 300. Thus, the antireflective coating 214 is formed as a continuous layer on the transparent front contact 210 covering the metal contacts 212.

It is notable that the exemplary R2R manufacturing process shown in FIGS. 3-9 and described above is merely exemplary, and that variations can occur in accordance with the present techniques. For instance, instead of depositing all of the above-described components via the R2R manufacturing process, a hybrid approach may be employed where an R2R process is used for some of the components and a different manufacturing technique is used for others. This approach may be useful when different application-specific components are needed. By way of example only, the above-described R2R manufacturing process can be used to form just the back contact 204 and the kesterite absorber layer 206 on the flexible ceramic substrate 202. The product can be divided into individual sections and then later processed to add an application specific buffer layer, transparent front contact layer, and optional metal contacts and/or antireflective coating, etc. (e.g., using a non-R2R process (es)) Further, additional components may be added, if so desired, to the above-described photovoltaic device 200.

Once the completed device passes through the final stage, the finished product can be re-wound onto a second roll. See, for example FIG. 10 which illustrates the flexible ceramic substrate 202 having the back contact 204, the kesterite absorber layer 206, the buffer layer 208, the transparent front contact 210, the metal contacts 212, and the antireflective coating 214 formed thereon (via R2R processing apparatus 300 as described above) being re-wound onto a second roll.

It is notable that in this particular configuration the roll from which the flexible ceramic substrate material is dispensed and fed continuously to the R2R processing apparatus is being referred to herein as the first roll (see description of FIG. 3, above), whereas the roll onto which the final product is re-wound (see FIG. 10) is being referred to herein as the second roll. The product re-wound onto the second roll can be stored for later processing (e.g., cutting-up into individual sections) or provided to the end-user for processing. Motor-driven drives can be employed at the first roll and/or at the second roll to feed and/or pull the flexible ceramic substrate material through the R2R processing apparatus 300.

It is also possible for the completed device to be processed immediately upon exiting the final stage of the R2R processing apparatus 300. See, for example, FIG. 11 which illustrates the flexible ceramic substrate 202 having the back contact 204, the kesterite absorber layer 206, the buffer layer 208, the transparent front contact 210, the metal contacts 212, and the antireflective coating 214 formed thereon (via R2R processing apparatus 300 as described above) being cut-up into individual sections. By way of example only, the action of a cutter 1102 can be coordinated with the speed with which the product exits R2R processing apparatus 300 to cut the sheet of the completed device into individual sections (of any desired length l).

As provided above, in order to achieve the proper heating duration for the kesterite absorber layer, it may be necessary to employ multiple heating elements at, for example, the third stage of R2R processing apparatus 300. See FIG. 12. For a given processing speed, increasing the number of heating elements increases the duration of the heating and vice versa. Since the R2R processing apparatus 300 forms the photovoltaic device 200 in a continuous line process (i.e., wherein each component is being continuously deposited), the product moves at a common speed through each of the stages. Thus, to use a simple example, if one were to add an additional heating element(s) then the amount of time the product is exposed to the heating elements is increased. It is further noted that, when multiple heating elements are employed, they do not have to be set to the same temperature. For instance, the temperature can increase and/or decrease along the sequence of heating elements, i.e., to provide a ramp-up and/or ramp-down heating cycle.

The present techniques are further described by way of reference to the following non-limiting examples.

EXAMPLE 1

Zirconia discs (40-μm thick, 40 millimeter (mm) available from ENrG inc., Buffalo, N.Y.) were deposited with Mo layers by sputtering. Kesterite $Cu_2ZnSn(Se,S)_4$ layers were fabricated by spin-coating hydrazine solutions (method adapted from U.S. Patent Application Publication Number 2014/0096826). After a hot plate anneal in a sulfur-containing atmosphere at a temperature greater than about 540° C., solar cells were fabricated from the above-described $Cu_2ZnSn(Se,S)_4$ films by deposition of a 60 nanometer (nm) CdS buffer layer by chemical bath deposition, 100 nm insulating ZnO and 130 nm ITO (indium-doped zinc oxide) by sputtering, followed by nickel/aluminum metal contacts deposited by electron-beam evaporation.

Figure 13:
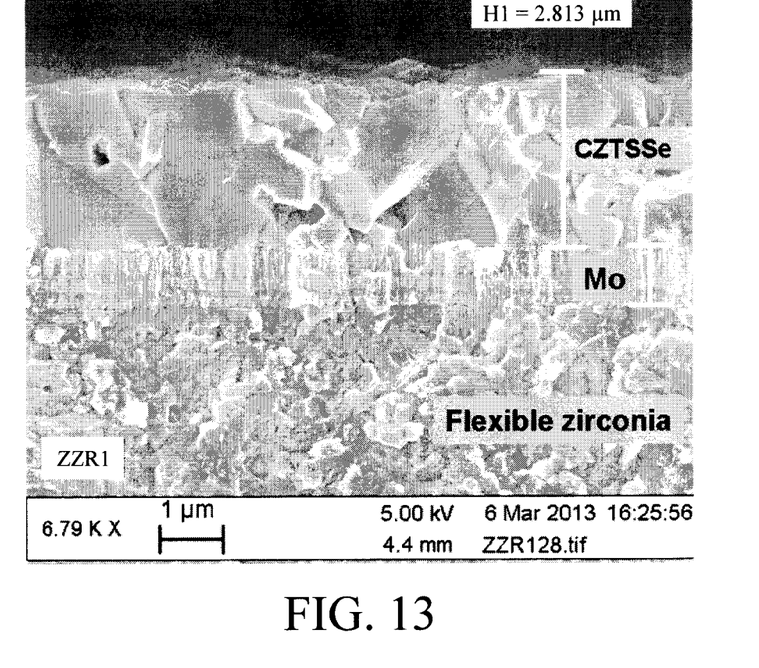
FIG. 13 is a scanning electron micrograph (SEM) of a kesterite film on a Mo-coated flexible ceramic substrate produced using the present techniques according to an embodiment of the present invention.

A scanning electron micrograph (SEM) image of a solar cell produced according to Example 1 is shown in FIG. 13. This solar cell had a photovoltaic efficiency of 9.06% at 1.5 AM conditions, with open-circuit voltage (Voc)=0.483 Volts, short-circuit current density (Jsc)=31.6 millamps/square centimeter ($mA/cm^2$), and Fill Factor=59%.

EXAMPLE 2 flexible Zirconia substrates (available from ENrG inc., Buffalo, N.Y.) were deposited with Mo layers by sputtering. Kesterite $Cu_2ZnSn(Se,S)_4$ layers were fabricated by spin-coating hydrazine solutions (method adapted from U.S. Patent Application Publication Number 2014/0096826). After a hot plate anneal in a sulfur-containing atmosphere at a temperature greater than about 540° C., solar cells were fabricated from the above-described $Cu_2ZnSn(Se,S)_4$ films by deposition of a 60 nm CdS buffer layer by chemical bath deposition, 100 nm insulating ZnO and 130 nm ITO (indium-doped zinc oxide) by sputtering, followed by nickel/aluminum metal contacts deposited by electron-beam evaporation and finally a 110 nm antireflection coating of magnesium fluoride ($MgF_2$).

Figure 14:
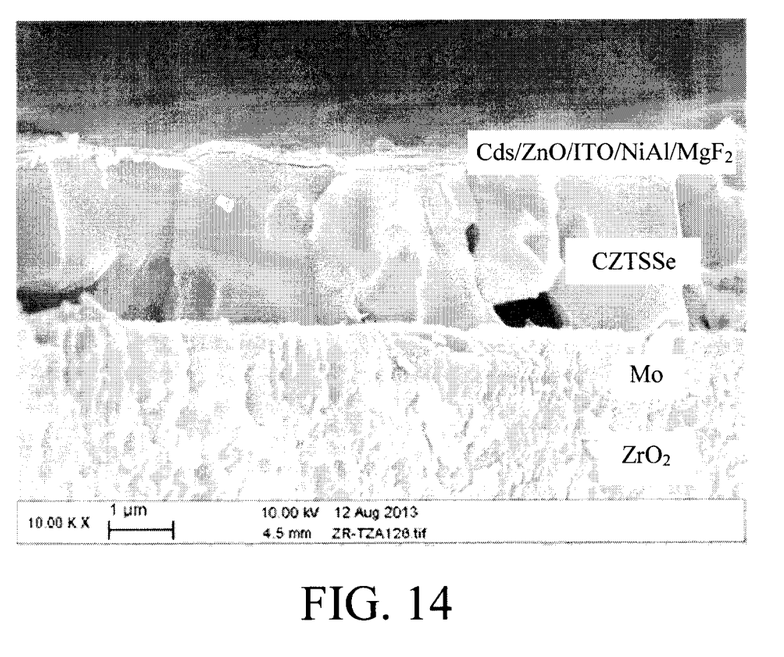
FIG. 14 is a SEM of a kesterite film on a Mo-coated flexible ceramic sheet produced using the present techniques according to an embodiment of the present invention.

A SEM image of a solar cell produced according to Example 2 is shown in FIG. 14. This solar cell had a photovoltaic efficiency of 11.5% at 1.5 AM conditions, with open-circuit voltage (Voc)=452 millivolts, short-circuit current density (Jsc)=38 $mA/cm^2$, and Fill Factor=66%.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of forming a photovoltaic device, comprising the steps of:
   forming a back contact on a flexible ceramic substrate, wherein the flexible ceramic substrate is bendable to a radius of curvature of at least one meter without breaking and has a thickness of from about 30 μm to about 50 μm;
   forming a kesterite absorber layer on a side of the back contact opposite the flexible ceramic substrate;
   annealing the kesterite absorber layer in a chalcogen environment containing each of sulfur, selenium, and tin;
   forming a buffer layer on a side of the kesterite absorber layer opposite the back contact; and
   forming a transparent front contact on a side of the buffer layer opposite the kesterite absorber layer.

2. The method of claim 1, wherein the flexible ceramic substrate comprises at least one of zirconium oxide, yttrium-stabilized zirconium oxide, aluminum oxide, and titanium dioxide.

3. The method of claim 1, wherein the kesterite absorber layer comprises copper, zinc, tin and at least one of sulfur and selenium.

4. The method of claim 3, wherein the kesterite absorber layer is a sulfo-selenide comprising both sulfur and selenium.

5. The method of claim 1, wherein the kesterite absorber layer is annealed at a temperature of greater than about 500° C.

6. The method of claim 1, wherein the kesterite absorber layer is annealed at a temperature of from about 540° C. to about 650° C.

7. The method of claim 1, further comprising the steps of:
   forming metal contacts on a side of the transparent front contact opposite the buffer layer; and
   forming an antireflective coating on the transparent front contact covering the metal contacts.

8. A roll-to-roll-based method of forming a photovoltaic device, comprising the steps of:

dispensing a sheet of a flexible ceramic substrate material from a roll, wherein the sheet of the flexible ceramic substrate is bendable to a radius of curvature of at least one meter without breaking;

passing the sheet of the flexible ceramic substrate material at a common speed through multiple processing stages;

forming, at a first processing stage, a back contact as a continuous layer on the sheet of the flexible ceramic substrate material;

forming, at a second processing stage, a kesterite absorber layer as a continuous layer on a side of the back contact opposite the continuous sheet of the flexible ceramic substrate material;

annealing, at a third processing stage, the kesterite absorber layer using multiple heating elements that are configured to heat the kesterite absorber layer, and varying a number of the multiple heating elements to vary a duration of the annealing;

forming, at a fourth processing stage, a buffer layer as a continuous layer on a side of the kesterite absorber layer opposite the back contact; and forming, at a fifth processing stage, a transparent front contact as a continuous layer on a side of the buffer layer opposite the kesterite absorber layer.

9. The method of claim 8, further comprising the step of:
spooling the flexible ceramic substrate material having the back contact, the kesterite absorber layer, the buffer layer, and the transparent front contact formed thereon onto another roll.

10. The method of claim 8, further comprising the step of:
cutting the flexible ceramic substrate material having the back contact, the kesterite absorber layer, the buffer layer, and the transparent front contact formed thereon into individual sections.

11. The method of claim 8, wherein the flexible ceramic substrate comprises zirconium oxide, yttrium-stabilized zirconium oxide, aluminum oxide, or titanium dioxide.

12. The method of claim 8, wherein the kesterite absorber layer is a sulfo-selenide comprising both sulfur and selenium.

13. The method of claim 8, wherein the kesterite absorber layer is annealed at a temperature of greater than about 500° C.

14. The method of claim 8, wherein the kesterite absorber layer is annealed at a temperature of from about 540° C. to about 650° C.

15. The method of claim 1, wherein the flexible ceramic substrate comprises at least one of zirconium oxide and yttrium-stabilized zirconium oxide.

16. The method of claim 8, wherein the flexible ceramic substrate comprises at least one of zirconium oxide and yttrium-stabilized zirconium oxide.

17. The method of claim 8, wherein heating elements are set at different temperatures from one another.

18. The method of claim 8, further comprising the steps of:
forming, at a sixth processing stage, metal contacts on a side of the transparent front contact opposite the buffer layer; and
forming, at a seventh processing stage, an antireflective coating on the transparent front contact covering the metal contacts.

19. The method of claim 8, wherein the multiple heating elements are each selected from the group consisting of: infrared (IR) heating elements, laser heating elements, flash annealing heating elements, and combinations thereof.

20. The method of claim 1, wherein a hybrid approach is used to form the photovoltaic device, the method further comprising the steps of:
using a roll-to-roll manufacturing process to form a product comprising the back contact and the kesterite absorber layer on the flexible ceramic substrate;
dividing the product into individual sections; and
processing the individual sections using a non-roll-to-roll manufacturing process to form an application-specific buffer layer on the kesterite absorber layer and to form the transparent front contact on the application-specific buffer layer.

* * * * *